United States Patent [19]

Araki

[11] Patent Number: 5,140,597
[45] Date of Patent: Aug. 18, 1992

[54] SEMICONDUCTOR MEMORY DEVICE HAVING MASK ROM STRUCTURE

[75] Inventor: Sunao Araki, Kawasaki, Japan

[73] Assignee: Fujitsu Limited, Kawasaki, Japan

[21] Appl. No.: 473,048

[22] Filed: Jan. 31, 1990

[30] Foreign Application Priority Data

Feb. 1, 1989 [JP] Japan ................... 1-23244

[51] Int. Cl.[5] ........................................... G06F 11/10
[52] U.S. Cl. ..................................... 371/51.1; 371/48; 371/49.1; 371/40.2; 365/200
[58] Field of Search .................. 371/51.1, 49.1, 40.4, 371/48, 40.1, 40.2, 30, 21.6, 21.2, 21.1; 365/200, 201

[56] References Cited

U.S. PATENT DOCUMENTS

| | | | |
|---|---|---|---|
| 4,045,779 | 8/1977 | Markle | 364/900 |
| 4,355,393 | 10/1982 | Kubo et al. | 371/51.1 |
| 4,463,450 | 7/1984 | Haeuesle | 365/10.1 |
| 4,483,003 | 11/1984 | Beal | 371/51.1 |
| 4,592,024 | 5/1986 | Sakai et al. | 365/200 |
| 4,615,030 | 9/1986 | Kumagai | 371/71 |
| 4,679,196 | 7/1987 | Tsujimoto | 371/51.1 |
| 4,729,117 | 3/1988 | Osaka | 365/200 |
| 4,780,875 | 10/1988 | Sakai | 371/38 |
| 4,875,212 | 10/1989 | Hashimoto | 371/40.2 |

FOREIGN PATENT DOCUMENTS 58-177594 10/1983 Japan .................... 371/30
60-46000 3/1985 Japan .

Primary Examiner—Jerry Smith
Assistant Examiner—Ly V. Hua
Attorney, Agent, or Firm—Staas & Halsey

[57] ABSTRACT

A semiconductor memory device is provided with a memory cell array having a plurality of memory cells formed by a mask ROM. The memory cell array has a data area in which stored data of n bits is stored and a parity area in which a one-bit parity code corresponding to the stored data is stored. A control circuit supplies the memory cell array with an address and reads out the stored data and the one-bit parity code designated by the address. A parity check circuit determines whether the data read out from the memory cell array has a bit error and generates a correction bit responsive thereto. A memory stores predetermined indicating data indicating which of the n bits of the stored data is defective. A data correction circuit then corrects one of the n bits of the data indicated by the predetermined indicating data in response to the correction bit generated by the parity check circuit.

17 Claims, 6 Drawing Sheets

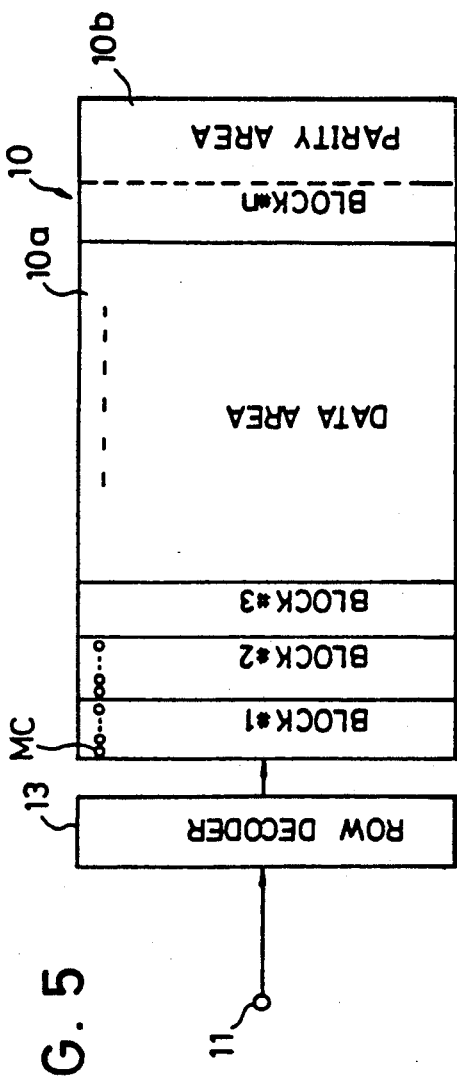
FIG. 5
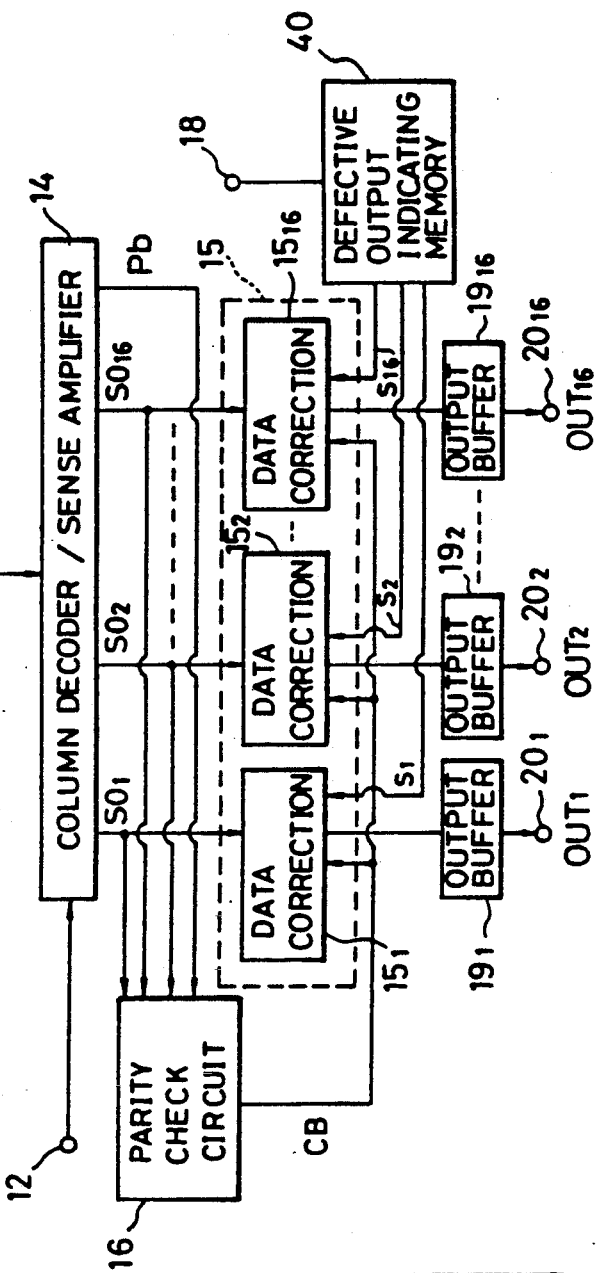
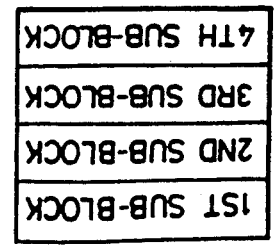
FIG. 6

SEMICONDUCTOR MEMORY DEVICE HAVING MASK ROM STRUCTURE

BACKGROUND OF THE INVENTION

The present invention relates to a semiconductor memory device having a mask ROM structure, and more particularly to a semiconductor memory device having an error correcting function.

A semiconductor memory device having a mask ROM structure is known. A memory cell array including a plurality of memory cells is configured by mask ROM elements. Information is written into the memory cell array during manufacturing the memory device. Once information is written into the memory cell array, it is impossible to revise the written information. Actually, a memory device has some defective memory cells. Thus, a programmable ROM is incorporated in the memory device. After fabricating the memory device, it is subjected to a test for locating defective memory cells. The address of each detected defective memory cell is written into the programmable ROM. That is, the defective memory cells are replaced by memory cells of the programmable ROM. When the address of a defective memory cell is designated, the corresponding memory cell of the programmable ROM is accessed and information stored therein is read out from the programmable ROM.

However, memory cells of the programmable ROM are larger than those of the mask ROM. For this reason, a large area on a chip must be provided for the programmable ROM. This decreases the integration density of the memory device. Further, it takes an extremely long time to write address information and data on defective memory cells into the programmable ROM.

SUMMARY OF THE INVENTION

It is a general object of the present invention to provide an improved semiconductor memory device having a mask ROM structure in which the aforementioned disadvantages are eliminated.

A more specific object of the present invention is to provide a semiconductor memory device having a mask ROM structure in which a reduced area of the programmable ROM on the chip is provided and it takes a reduced time to write information indicating the positions and data of defective memory cells into the programmable ROM.

The above objects of the present invention are achieved by a semiconductor memory device comprising a memory cell array having a plurality of memory cells and formed by a mask ROM, the memory cell array having a data area in which data of n bits (n is an arbitrary number) is stored and a parity area in which a one-bit parity code relating to the data is stored; control means, coupled to the memory cell array, for supplying the memory cell array with an address and reading out the data and the one-bit parity code designated by the address; parity check means, coupled to the memory cell array, for determining whether or not the data read out from the memory cell array has a bit error and for generating correction data indicating a determination result; memory means for storing defective output indicating data indicating one of the n bits of the data having the bit error; and data correcting means, coupled to the memory cell array, the parity check means and the memory means, for correcting one of the n bits of the data indicated by the defective output indicating data by the correction bit.

The above-mentioned objects of the present invention are achieved by a semiconductor memory device comprising a memory cell array having a plurality of memory cells and formed by a mask ROM, the memory cell array having a data area in which data of n bits (n is an arbitrary number) is stored and a parity area in which a one-bit parity code relating to the data is stored, the data area being divided into blocks each divided into m sub-blocks (m is an arbitrary number); control means, coupled to the memory cell array, for supplying the memory cell array with an address including information indicating one of the m sub-blocks and reading out the data and the one-bit parity code designated by the address; parity check means, coupled to the memory cell array, for determining whether or not the data read out from the memory cell array has a bit error and for generating correction data indicating a determination result; memory means for storing defective output indicating data indicating one of the m sub-blocks of each of the blocks relating to the bit error; and data correcting means, coupled to the memory cell array, the parity check means and the memory means, for correcting, by the correction bit supplied from the parity check means, one of the n bits of the data relating to the one of the m sub-blocks indicated by the defective output indicating data supplied from the memory means.

Further objects, features and advantages of the present invention will become apparent from the following detailed description when read in conjunction with the accompanying drawings.

BRIEF DESCRIPTION OF THE DRAWINGS

FIG. 5 is a block diagram of a second preferred embodiment of the present invention;

FIG. 6 is a diagram illustrating one block which is divided into four sub-blocks;

DESCRIPTION OF THE PREFERRED EMBODIMENTS

Figure 1:
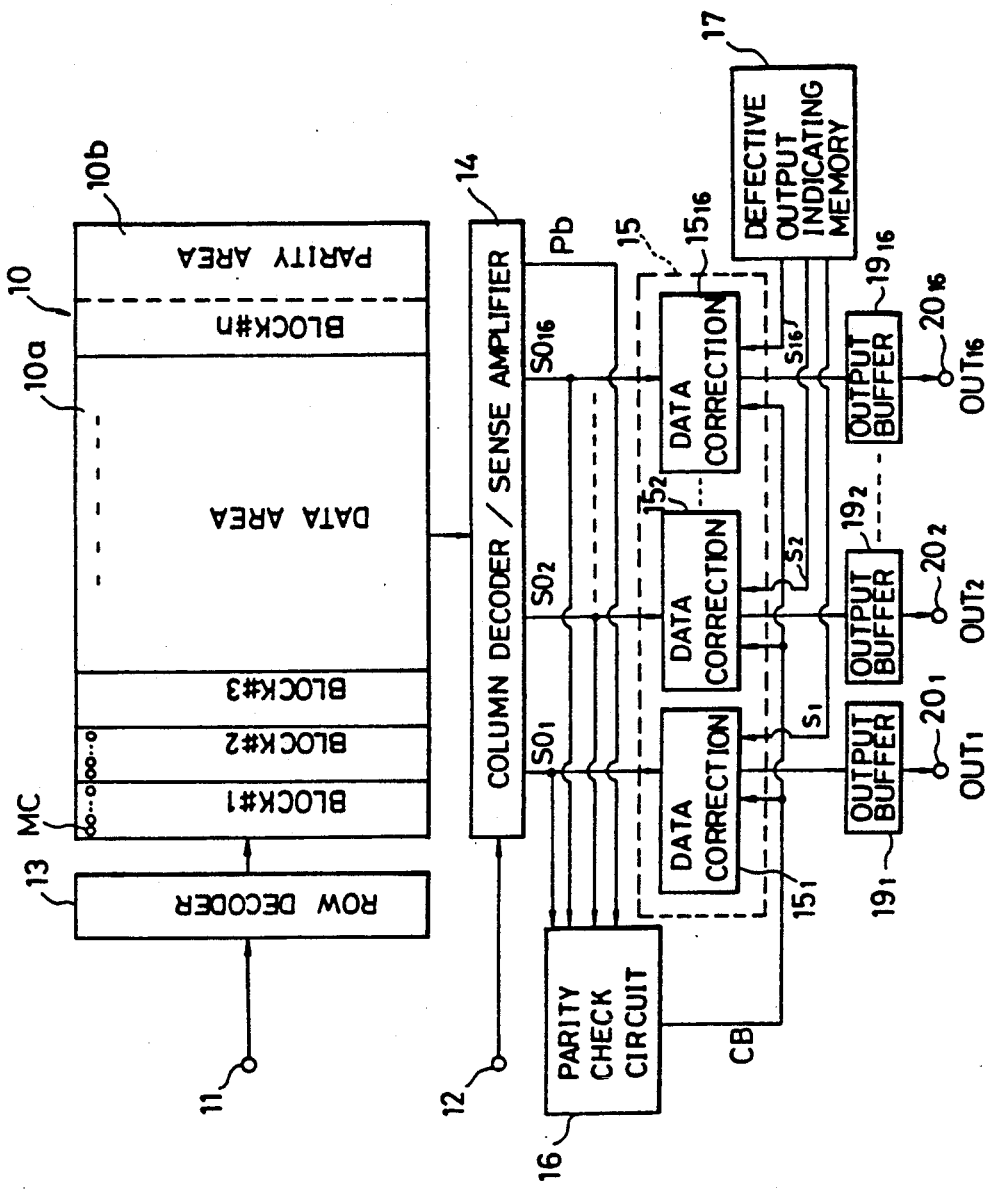
FIG. 1 is a block diagram of a semiconductor memory device according to a first preferred embodiment of the present invention.

Referring to FIG. 1, a semiconductor memory device includes a memory cell array 10 formed by a mask ROM. The memory cell array 10 is divided into a data area 10a and a parity area 10b. In the data area 10a, each row is divided into n blocks (n is an arbitrary number). For example, each row is divided into 16 blocks. Each block stores data composed of a predetermined number of bits, for example, 16 bits. In this case, each block has 16 memory cells MC. The parity area 10b stores, for each row, an even (or odd) number parity bit provided for each data of n bits, each of which relates to the respective block. Thus, n even (or odd) number parity bits are stored in the parity area 10b for each row. In the following description, each row of the data array 10a is divided into 16 blocks, each of which stores 16 bits for each row.

A row address is input to a row decoder 13 through a terminal 11, and a column address is input to a column decoder/sense amplifier 14 through a terminal 14. The row decoder 13 decodes the row address and selects one of a plurality of word lines (rows). When a decoded row address is supplied to the memory cell array 10, data and the parity bits relating to the designated row are read out therefrom and supplied to the column decoder/sense amplifier 14. The column decoder/sense amplifier 14 decodes the column address and selects data of 16 bits and a corresponding one-bit parity code relating to a decoded column address among from the data and one-bit parity codes read out from the memory cell array 10. The 16 data bits selected by the column decoder/sense amplifier 14 are supplied to a data correction block 15 and a parity check circuit 16. At the same time, the one-bit parity code relating to the selected data equal to 16 bits is supplied to the parity check circuit 16. The data correction block 15 is made up of 16 data correction circuits $15_1, 15_2, \ldots, 15_{16}$.

Figure 2:
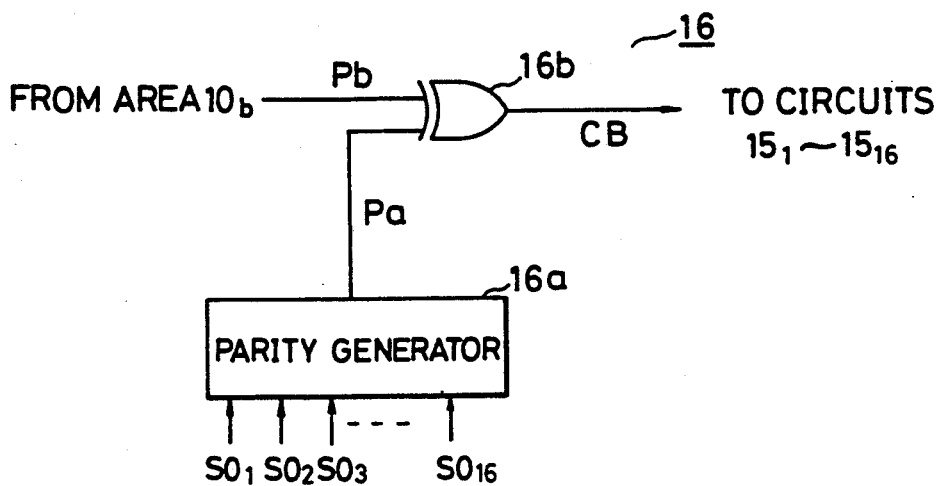
FIG. 2 is a circuit diagram of a parity check circuit shown in FIG. 1.

FIG. 2 is a circuit diagram of the parity check circuit 16. As is shown, the parity check circuit 16 is made up of a parity generator 16a and an exclusive-OR gate (XOR gate) 16b. The parity generator 16a receives the selected 16-bit data labeled $SO_1, SO_2, \ldots, SO_{16}$ and derives a one-bit parity output Pa. The XOR gate 16b receives the one-bit parity output Pa and the one-bit parity code labeled Pb supplied from the parity area 10b through the column decoder/sense amplifier 14, and generates a correction bit CB. When a parity error is detected, the correction bit CB is '1'. On the other hand, when no parity error is detected, the correction bit CB is '0'. The correction bit CB is supplied to the data correction circuits $15_1$-$15_{16}$.

A defective output indicating memory 17 formed by a programmable ROM such as a fuse ROM stores address information for each 16-bit data. Address information indicates which one of the 16 bits forming a 16-bit data is defective if the 16-bit data has a one-bit error. The memory device is tested after it is manufactured. In test, it is determined whether each memory cell of the data area 10a generates a bit error.

Figure 3:
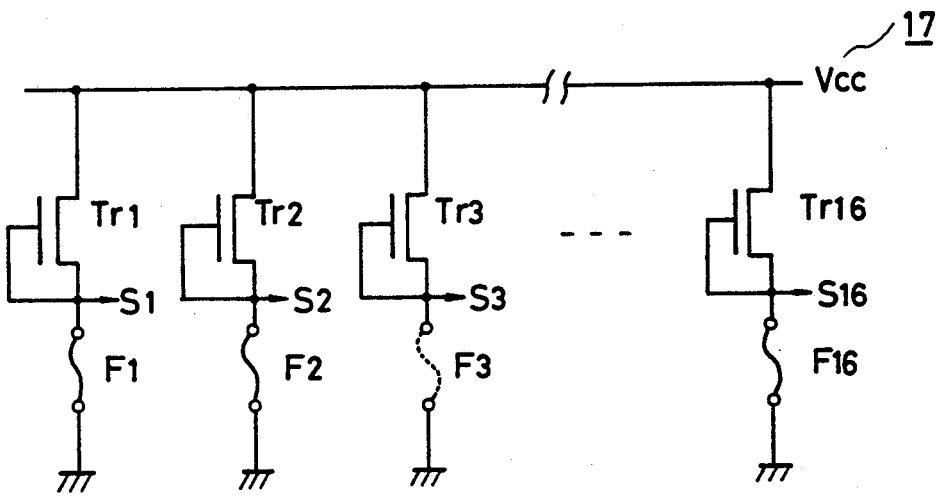
FIG. 3 is a circuit diagram of a defective output indicating memory shown in FIG. 1.

FIG. 3 is a circuit diagram of the defective output indicating memory 17. As is illustrated, the defective output indicating memory 17 has 16 transistors $Tr_1, Tr_2, Tr_3, \ldots, Tr_{16}$ and 16 fuses $F_1, F_2, F_3, \ldots, F_{16}$ for each 16-bit data. Select data $S_1, S_2, S_3, \ldots, S_{16}$ are drawn from the nodes of the transistors $Tr_1, Tr_2, Tr_3, \ldots, Tr_{16}$ and the fuses $F_1, F_2, F_3, \ldots, F_{16}$, respectively. When it is determined that one-bit data (memory cell) corresponding to the fuse $F_3$ for example, generates a bit error, the fuse $F_3$ is broken, and the other fuses relating to data bits having no error are held as they are. In this case, the select data $S_3$ is switched to a high level (Vcc; a positive power source voltage), and the other select data are maintained at a low level (ground level). The select data $S_1$-$S_{16}$ are supplied to the data correction circuits $15_1$-$15_{16}$, respectively.

Figure 4:
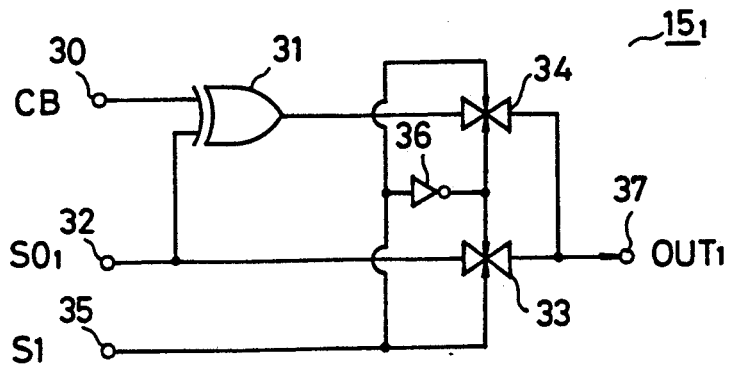
FIG. 4 is a circuit diagram of each data correction circuit shown in FIG. 1.

FIG. 4 is a circuit diagram of the data correction circuit $15_1$. Each of the data correction circuits $15_2$-$15_{16}$ has the same structure as the data correction circuit $15_1$. The correction bit CB from the parity check circuit 16 is supplied to an XOR gate 31 through a terminal 30. The data bit $SO_1$ from the column decoder/sense amplifier 14 is supplied to the XOR gate 31 and a transmission gate 33 through a terminal 32. The XOR gate 31 inverts the data bit $SO_1$ when the correction bit CB is '1', and passes the data bit $SO_1$ as it is when the correction bit CB is '0'. The output from the XOR gate 31 is supplied to a transmission gate 34. Each of the transmission gates 33 and 34 is supplied with the select data $S_1$ through a terminal 35 and inverted data thereof formed through an inverter 36. When the select data $S_1$ is '0', the transmission gate 33 conducts. On the other hand, when the select data $S_1$ is '1', the transmission gate 34 conducts. The output from each of the transmission gates 33 and 34 passes through a terminal 37 and is applied, as an output $OUT_1$, to an output buffer $19_1$ (FIG. 1).

Table 1 represents the operation of the data correction circuit $15_1$. Each of the other data correction circuits $15_2$-$15_{16}$ operates in the same way as the data correction circuit $15_1$.

TABLE 1

| $S_1$ | CB | $SO_1$ | $OUT_1$ |
|---|---|---|---|
| 0 | — | 1 | 1 |
| 0 | — | 0 | 0 |
| 1 | 0 | 1 | 1 |
| 1 | 0 | 0 | 0 |
| 1 | 1 | 1 | 0 |
| 1 | 1 | 0 | 1 |

By the above-mentioned manner, one of the 16 data bits relating to a defective memory cell in the data area 10a (FIG. 1) is corrected by a corresponding one of the data correction circuits $15_1$-$15_{16}$. The outputs from the data correction circuits $15_1$-$15_{16}$ are amplified by the output buffers $19_1$-$19_{16}$ and then output through terminals $20_1$-$20_{16}$, respectively.

A description is given of a second embodiment of the present invention with reference to FIG. 5, in which those parts which are the same as those shown in FIG. 1 are given the same reference numerals. As is shown in FIG. 6, each block #1, #2, ..., #16 is divided into m blocks (m is an arbitrary integer), four sub-blocks in the illustrated case. One of the four sub-blocks is designated by two high-order bits of the column address applied to the terminal 12. The defective output indicating memory 17 shown in FIG. 1 is replaced by a defective output indicating memory 40 having a terminal 18.

Figure 7:
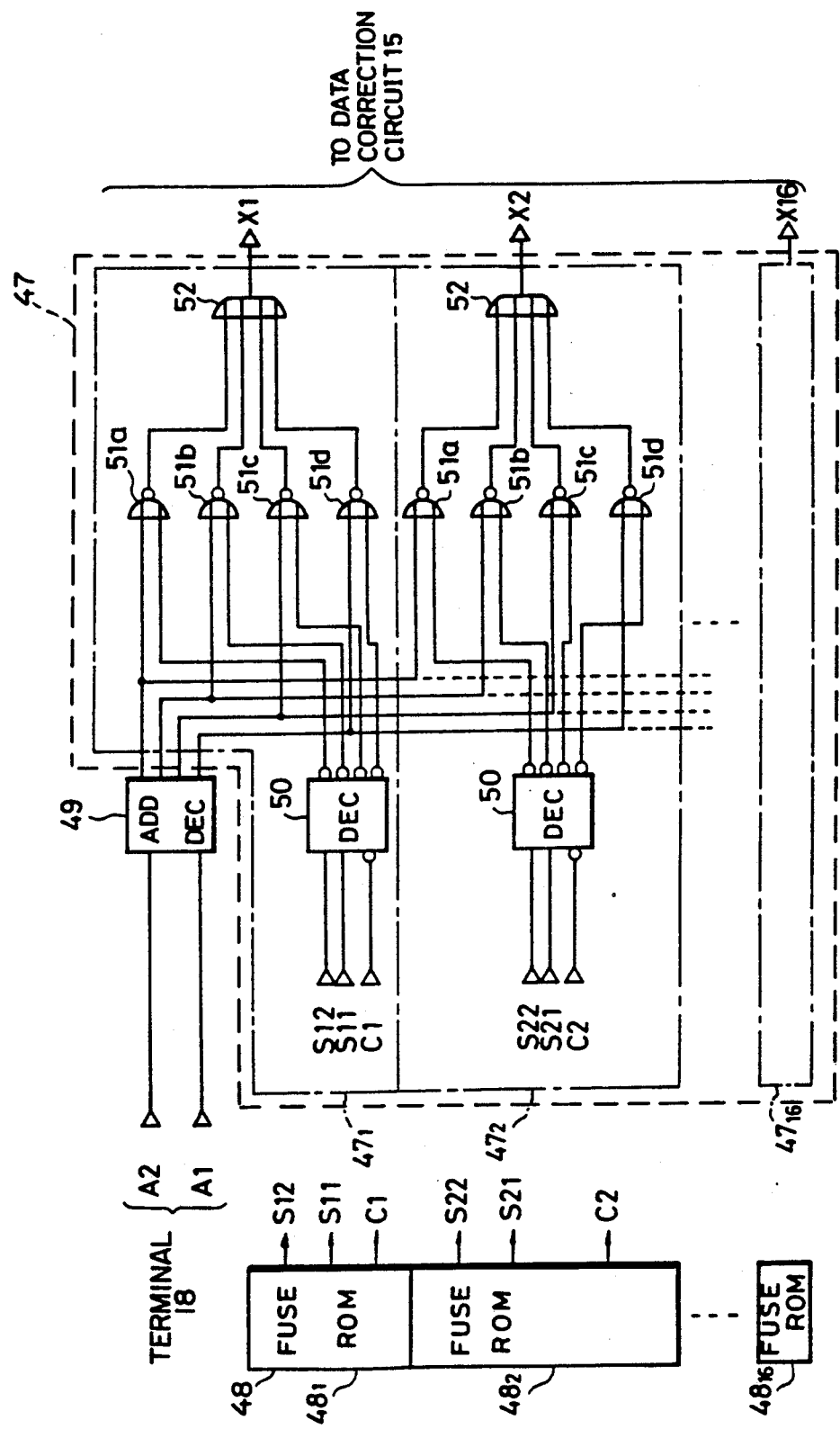
FIG. 7 is a circuit diagram of a defective output indicating memory shown in FIG. 5.

FIG. 7 is a circuit diagram of the defective output indicating memory 40. As is shown, the detective output indicating memory 40 is made up of a logic circuit 47, a programmable ROM 48 such as a fuse ROM, and an address decoder 49. The aforementioned two high-order bits of the column address labeled A1 and A2 (terminal 18 in FIG. 5) are applied to the address decoder 49, which outputs a decoded signal consisting of four bits. The fuse ROM 48 is divided into 16 circuits $48_1, 48_2, \ldots, 48_{16}$. The logic circuit 47 is divided into 16 sections $47_1, 47_2, \ldots, 47_{16}$. The circuits $48_1, 48_2, \ldots, 48_{16}$ of the fuse ROM 48 are provided for the sections $47_1, 47_2, \ldots, 47_{16}$ of the logic circuit 47, respectively. The circuit $48_1$ generates a control signal $C_1$ and a pair of sub-block designation signals $S_{11}$ and $S_{12}$. The control signal $C_1$ indicates whether or not the corresponding output from the data area $10a$ of the memory cell array 10 through the column decoder/sense amplifier 14 (FIG. 6) should be corrected. The pair of sub-block designation signals $S_{11}$ and $S_{12}$ indicates one of the four sub-blocks which has a defective memory cell to be corrected. Each of the other circuits $48_2$–$48_{16}$ generates a control signal such as $C_2$ and a pair of sub-block designation signals such as $S_{21}$ and $S_{22}$ in the same way as the circuit $48_1$.

The control signal $C_1$ and the pair of sub-block designation signals $S_{11}$ and $S_{12}$ are supplied to a decoder 50 of the section $47_1$ of the logic circuit 47. The section $47_1$ decodes the input signals and generates four decoded signals. The section $47_1$ of the logic circuit 47 includes NOR gates $51a$, $51b$, $51c$ and $51d$, and an OR gate 52. The four decoded signals derived from the decoder 50 are supplied to the respective NOR gates $51a$, $51b$, $51c$ and $51d$, which are also supplied with the respective signals supplied from the address decoder 49. Four outputs from the NOR gates $51a$, $51b$, $51c$ and $51d$ are input to the OR gate 52, which outputs a one-bit select signal $X_1$. Each of the sections $47_2$–$47_{16}$ is configured in the same way as the section $47_1$, and outputs a corresponding one-bit select signal. The select signals $X_1$, $X_2$, ..., $X_{16}$ are supplied to the data correction circuits $15_1$, $15_2$, ..., $15_{16}$.

The relationship between the signals $C_1$, $S_{11}$ and $S_{12}$ and one of the sub-blocks to be corrected is shown in Table 2.

TABLE 2

| $C_1$ | $S_{12}$ | $S_{11}$ | Parity correction |
|---|---|---|---|
| L | L | L | first sub-block |
| L | L | H | second sub-block |
| L | H | L | third sub-block |
| L | H | H | fourth sub-block |
| H | X | X | no correction |

Figure 8:
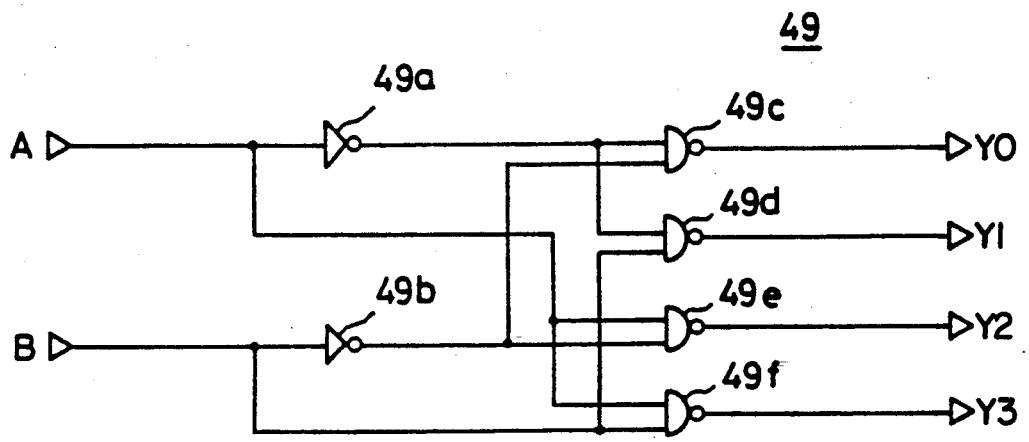
FIG. 8 is a circuit diagram of an address decoder shown in FIG. 7.

FIG. 8 is a circuit diagram of the address decoder 49 shown in FIG. 7. The address decoder 49 is composed of two inverters $49a$ and $49b$, and four NAND gates $49c$, $49d$, $49e$ and $49f$. Two inputs A and B are decoded and four outputs Y0, Y1, Y2 and Y3 are generated.

Figure 9:
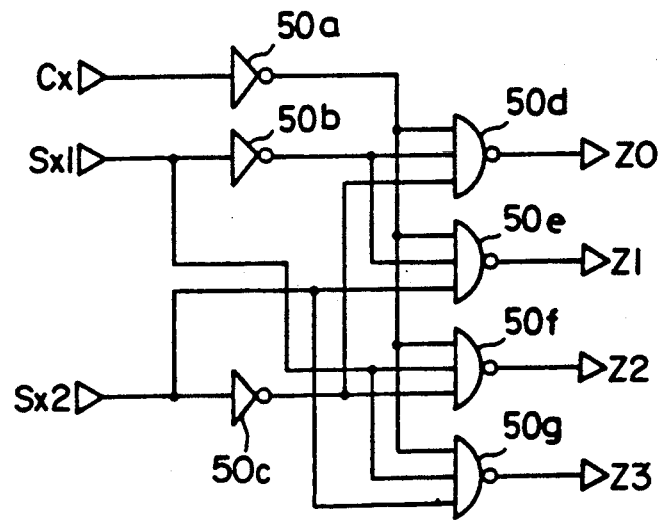
FIG. 9 is a circuit diagram of a decoder provided in each logic circuit shown in FIG. 7.

FIG. 9 is a circuit diagram of each decoder 50 shown in FIG. 7. The decoder 50 is composed of three inverters $50a$, $50b$ and $50c$, and four NAND gates $50d$, $50e$, $50f$ and $50g$. Three inputs Cx, Sx1, Sx2 (corresponding to the aforementioned control signal such as $C_1$ and sub-block designation signals such as $S_{11}$ and $S_{12}$) are decoded and four outputs Z0, Z1, Z2 and Z3 are generated. The fuse ROM 48 is configured by transistors and fuses in the same manner as the aforementioned arrangement shown in FIG. 3.

Turning to FIG. 7, when the two high-order bits A1 and A2 of the column address indicates the first block and the decoder of the section $47_1$ of the logic circuit 47 indicates that the first block is to be corrected, for example, the OR gate 52 outputs the select signal $X_1$ maintained at the high level ('1'). It is noted that two bits in the same sub-block are defective, it is impossible to correct those bits.

According to the present invention, it is possible to correct one-bit data only by storing one-bit address information on a defective memory cell in the programmable ROM. Thus, a large-capacity programmable ROM is unnecessary. As a result, it is possible to suppress an increase of the chip area and reduce the time it takes to write address information into the programmable ROM.

Figure 10:
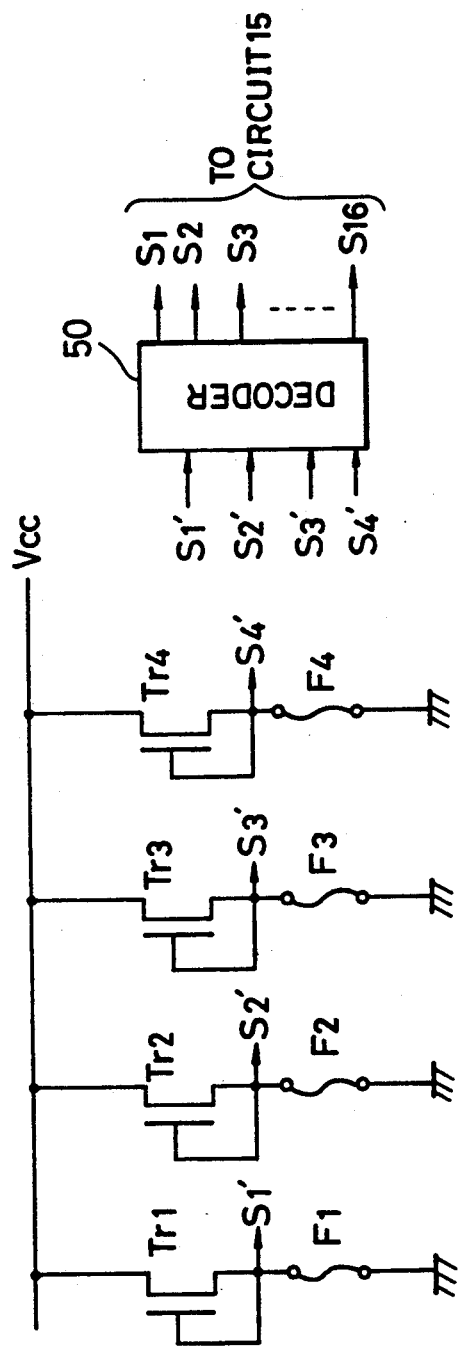
FIG. 10 is a circuit diagram of an alternative configuration of the defective output indicating memory shown in FIG. 3.

An alternative cofiguration of the defective output indicating memory 17 shown in FIG. 3 is illustrated in FIG. 10. The alternative configuration includes four transistors $Tr_1$–$Tr_4$, four associated fuses $F_1$–$F_4$ and a decoder circuit 50. The select signals $S_1'$–$S_4'$ are supplied to the decoder circuit 50, which decodes the select signals $S_1'$–$S_4'$ and derives the 16 select signals $S_1$–$S_{16}$ therefrom.

The present invention is not limited to the aforementioned embodiments, and variations and modifications may be made without departing from the scope of the present invention.

What is claimed is:

1. A semiconductor memory device, comprising:
a memory cell array having a plurality of memory cells and formed by a mask ROM, said memory cell array having a data area in which a plurality of stored data of n bits is stored and a parity area in which a one-bit parity code corresponding to said plurality of stored data is stored;
control means for supplying said memory cell array with an address and for reading out from said memory cell array the stored data and the one-bit parity code designed by the address;
parity check means for determining whether the stored data read out from said memory cell array has a bit error and for generating correction data responsive thereto;
memory means for storing predetermined indicating data indicative of which of the n bits of the stored data is defective; and
data correcting means for correcting the one of the n bits of the stored data indicated by the predetermined indicating data in response to the correction data generated by said parity check means.

2. A semiconductor memory device as claimed in claim 1, wherein said data correcting means comprises a correction circuit provided for each of the n bits of said data, wherein said correction circuit includes:
an exclusive-OR gate having a first input terminal supplied with the correction data, a second input terminal supplied with a corresponding one of the n bits of the stored data, and an output terminal through which an output signal of said exclusive-OR gate is drawn; and
selecting means for selecting one of the output signal from said exclusive-OR gate and the corresponding one of the n bits of the stored data in accordance with said defective output indicating data from said memory means.

3. A semiconductor memory device as claimed in claim 2, wherein the predetermined indicating data has n bits provided for the respective n bits of the stored data, and a corresponding one of the n bits of the predetermined indicating data is supplied to said selecting means.

4. A semiconductor memory device as claimed in claim 3, wherein said selecting means selects said output signal from said exclusive-OR gate when said corresponding one of the n bits of the predetermined indicating data indicates a bit error.

5. A semiconductor memory device as claimed in claim 1, wherein said memory means comprises n programmable memory elements which are provided for the stored data of n bits and which store the predetermined indicating data relating to the respective n bits of the stored data.

6. A semiconductor memory device as claimed in claim 5, wherein each of the said programmable memory elements comprises a fuse ROM element.

7. A semiconductor memory device as claimed in claim 1, wherein said data area of the memory cell array is divided into n blocks and the stored data of n bits is formed by one-bit data read out from each of said n blocks.

8. A semiconductor memory device as claimed in claim 1, wherein said parity check means comprises:
a parity generator which receives the stored data of n bits and generates output parity data; and
an exclusive-OR gate having a first input terminal supplied with the output parity data, a second input terminal supplied with the one-bit parity code from said memory cell array, and an output terminal through which the correction data is output to said data correcting means.

9. A semiconductor memory device as claimed in claim 1, said memory means comprises:
a predetermined number of programmable memory elements less than the number n for storing information relating to the predetermined indicating data; and
decoder means, coupled to said programmable memory elements, for decoding said information stored in said programmable memory elements and for generating the predetermined indicating data in n bits.

10. A semiconductor memory device as claimed in claim 1, wherein the one-bit parity code stored in the parity area of said memory cell array is an even or an odd number parity bit for the stored data of n bits.

11. A semiconductor memory device, comprising:
a memory cell array having a plurality of memory cells and formed by a mask ROM, said memory cell array having a data area in which a plurality of stored data of n bits is stored and a parity area in which a one-bit parity code corresponding to said plurality of stored data is stored, said data area being divided into blocks each divided into m sub-blocks;
control means for supplying said memory cell array with an address including address information indicating one of said m sub-blocks and for reading out from said memory cell array the stored data and the one-bit parity code designated by the address;
parity check means for determining whether the stored data read out from said memory cell array has a bit error and for generating correction data responsive thereto;
memory means for storing predetermined indicating data indicative of which of the n bits in which of the m sub-blocks is defective; and
data correcting means for correcting the one of the n bits of said stored data in the one of the m sub-blocks indicated by the predetermined indicating data in response to the correction data generated by said parity check means.

12. A semiconductor memory device as claimed in claim 11, wherein said memory means comprises:

programmable memory means, provided for each of the n bits of the stored data, for storing first information indicating whether a corresponding one of the n bits of the stored data should be corrected and second information designating one of the m sub-blocks relating to a corresponding one of the blocks;
address decoder means for deriving a decoded sub-block address indicating one of the m sub-blocks from the address; and
logic means, coupled to said programmable memory means and said address decoder means, for deriving the predetermined indicating data indicating one of the m sub-blocks of each of the blocks relating to a bit error from the first and second information and the decoded sub-block address.

13. A semiconductor memory device as claimed in claim 12, wherein said logic means provided in said memory means comprises:
decoder means for decoding the first and second information supplied from said programmable memory means and generating a decoded output; and
gate means, coupled to said decoder means, for deriving the predetermined indicating data from the decoded sub-block address supplied from said address decoder means and said decoded output from said decoder means of said logic means.

14. A semiconductor memory device as claimed in claim 12, wherein said programmable memory means includes fuse ROM elements.

15. A semiconductor memory device as claimed in claim 11, wherein said data correcting means comprises a correction circuit provided for each of the n bits of the stored data, and wherein said correction circuit includes:
an exclusive-OR gate having a first input terminal supplied with the correction data, a second input terminal supplied with a corresponding one of the n bits of the stored data, and an output terminal through which an output signal of said exclusive-OR gate is drawn; and
selecting means for selecting one of the output signal of said exclusive-OR gate and the corresponding one of the n bits of the stored data in accordance with the predetermined indicating data from said memory means.

16. A semiconductor memory device as claimed in claim 15, wherein the predetermined indicating data has n bits provided for the respective n bits of the stored data, and a corresponding one of the n bits the predetermined indicating data is supplied to said selecting means.

17. A semiconductor memory device as claimed in claim 11, wherein said parity check means comprises:
a parity generator which receives the stored data of n bits and generates output parity data; and
an exclusive-OR gate having a first input terminal supplied with the output parity data, a second input terminal supplied with the one-bit parity code from said memory cell array, and an output terminal through which the correction data is output to said data correcting means.

* * * * *

UNITED STATES PATENT AND TRADEMARK OFFICE
CERTIFICATE OF CORRECTION

PATENT NO. : 5,140,597
DATED : August 18, 1992
INVENTOR(S) : Araki

It is certified that error appears in the above-indentified patent and that said Letters Patent is hereby corrected as shown below:

Column 5, line 48, "Sx1, Sx2" should be --$S_{x1}$, $S_{x2}$--.

Column 6, line, "cofiguration" should be --configuration--.

Signed and Sealed this

Twenty-first Day of December, 1993

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,140,597
DATED : August 18, 1992
INVENTOR(S) : Araki

It is certified that error appears in the above-identified patent and that said Letters Patent is hereby corrected as shown below:

Title page, [73] Assignee, after "Fujitsu Limited, Kawasaki, Japan" insert --and Fujitsu VLSI Limited, Kasugai, Japan--.

Col. 5, line 48, "Sx1, Sx2" should be --$S_{x1}$, $S_{x2}$--.

Col. 6, line 3, "cofiguration" should be --configuration--.

This Certificate supersedes Certificate of Correction issued December 21, 1993.

Signed and Sealed this

Seventh Day of June, 1994

Attest:

BRUCE LEHMAN

Attesting Officer

Commissioner of Patents and Trademarks